(12) United States Patent
Zarabadi et al.

(10) Patent No.: US 11,718,190 B1
(45) Date of Patent: Aug. 8, 2023

(54) SYSTEMS AND METHODS FOR GALVANIC INTERFACE BOND DETECTION FOR INVERTER FOR ELECTRIC VEHICLE

(71) Applicant: Delphi Technologies IP Limited, St. Michael (BB)

(72) Inventors: Seyed R. Zarabadi, Kokomo, IN (US); Srikanth Vijaykumar, Carmel, IN (US)

(73) Assignee: Delphi Technologies IP Limited, St. Michael (BB)

( * ) Notice: Subject to any disclaimer, the term of this patent is extended or adjusted under 35 U.S.C. 154(b) by 0 days.

(21) Appl. No.: 18/155,141

(22) Filed: Jan. 17, 2023

Related U.S. Application Data

(60) Provisional application No. 63/377,486, filed on Sep. 28, 2022, provisional application No. 63/377,501, filed on Sep. 28, 2022, provisional application No. 63/377,512, filed on Sep. 28, 2022, provisional application No. 63/378,601, filed on Oct. 6, 2022.

(51) Int. Cl.
*H04B 5/00* (2006.01)
*B60L 50/60* (2019.01)

(52) U.S. Cl.
CPC ........... *B60L 50/60* (2019.02); *B60L 2210/40* (2013.01)

(58) Field of Classification Search
CPC ...................................................... B60L 50/60
See application file for complete search history.

(56) References Cited

U.S. PATENT DOCUMENTS

| | | | |
|---|---|---|---|
| 6,587,062 B1* | 7/2003 | Reinhold | G06F 3/05 |
| | | | 341/143 |
| 6,812,553 B2 | 11/2004 | Gerbsch et al. | |
| 6,943,293 B1 | 9/2005 | Jeter et al. | |
| 7,095,098 B2 | 8/2006 | Gerbsch et al. | |
| 7,229,855 B2 | 6/2007 | Murphy | |
| 7,295,433 B2 | 11/2007 | Taylor et al. | |
| 7,538,425 B2 | 5/2009 | Myers et al. | |
| 7,551,439 B2 | 6/2009 | Peugh et al. | |
| 9,673,809 B1* | 6/2017 | Kandah | H02P 27/08 |
| 2016/0119030 A1* | 4/2016 | Shrestha | H04B 5/005 |
| | | | 375/256 |
| 2019/0207560 A1* | 7/2019 | Sahu | H03F 3/211 |

* cited by examiner

*Primary Examiner* — Jared Fureman
*Assistant Examiner* — Esayas G Yeshaw
(74) *Attorney, Agent, or Firm* — Joshua M. Haines; Bookoff McAndrews, PLLC

(57) ABSTRACT

A system comprises an inverter including a first galvanic isolator separating a low voltage area from a high voltage area, a second galvanic isolator separating the low voltage area from the high voltage area, a first bias network connected to the first galvanic isolator, a second bias network connected to the second galvanic isolator, a first filter connected to the first bias network, a second filter connected to the second bias network, a first amplifier connected to the first filter, a second amplifier connected to the second filter, and an open detector connected to the first amplifier and the second amplifier.

20 Claims, 8 Drawing Sheets

SYSTEMS AND METHODS FOR GALVANIC INTERFACE BOND DETECTION FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods for an open bond wire detector for a galvanic interface for an inverter for an electric vehicle, and, more particularly, to systems and methods for an open bond wire detector for a galvanic interface for a power module for an inverter for an electric vehicle.

BACKGROUND

Inverters, such as those used to drive a motor in an electric vehicle, for example, are responsible for converting High Voltage Direct Current (HVDC) into Alternating Current (AC) to drive the motor. In an inverter, connection issues across a galvanic interface may affect an operation of a gate driver and/or power device switches, and therefore may affect an operation of the inverter.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: a first galvanic isolator separating a low voltage area from a high voltage area, the first galvanic isolator having a first galvanic isolator output path; a second galvanic isolator separating the low voltage area from the high voltage area, the second galvanic isolator having a second galvanic isolator output path; a first bias network in the high voltage area, and connected to the first galvanic isolator via the first galvanic isolator output path, the first bias network having a first bias network output path; a second bias network in the high voltage area, and connected to the second galvanic isolator via the second galvanic isolator output path, the second bias network having a second bias network output path; a first filter in the high voltage area, and connected to the first bias network via the first bias network output path, the first filter having a first filter output path; a second filter in the high voltage area, and connected to the second bias network via the second bias network output path, the second filter having a second filter output path; a first amplifier in the high voltage area, and connected to the first filter via the first filter output path, the first amplifier having a first amplifier output path; a second amplifier in the high voltage area, and connected to the second filter via the second filter output path, the second amplifier having a second amplifier output path; and an open detector in the high voltage area, the open detector connected to the first amplifier via the first amplifier output path and connected to the second amplifier via the second amplifier output path.

In some aspects, the techniques described herein relate to a system, further including: a pulse transceiver in the low voltage area, the pulse transceiver connected to the first galvanic isolator via a first pulse transceiver output path and connected to the second galvanic isolator via a second pulse transceiver output path.

In some aspects, the techniques described herein relate to a system, further including a main receiver.

In some aspects, the techniques described herein relate to a system, wherein the pulse transceiver and the main receiver are configured to operate together to transmit a Pulse Width Modulation signal from the low voltage area to the high voltage area.

In some aspects, the techniques described herein relate to a system, wherein the pulse transceiver is configured to output a first pulse on the first pulse transceiver output path and a second pulse on the second pulse transceiver output path.

In some aspects, the techniques described herein relate to a system, wherein the pulse transceiver is further configured to receive a primary pulse, and output the first pulse and the second pulse, based on the received primary pulse.

In some aspects, the techniques described herein relate to a system, wherein: the first galvanic isolator is configured to receive the first pulse on the first pulse transceiver output path, and send a first galvanic isolator pulse on the first galvanic isolator output path based on the received first pulse, and the second galvanic isolator is configured to receive the second pulse on the second pulse transceiver output path, and send a second galvanic isolator pulse on the second galvanic isolator output path based on the received second pulse.

In some aspects, the techniques described herein relate to a system, wherein: the first bias network is configured to receive the first galvanic isolator pulse on the first galvanic isolator output path, process the first galvanic isolator pulse based on one or more properties of the first bias network, and send a first biased pulse on the first bias network output path based on the processed first galvanic isolator pulse, and the second bias network is configured to receive the second galvanic isolator pulse on the second galvanic isolator output path, process the second galvanic isolator pulse based on one or more properties of the second bias network, and send a second biased pulse on the second bias network output path based on the processed second galvanic isolator pulse.

In some aspects, the techniques described herein relate to a system, wherein: the first filter is configured to receive the first biased pulse on the first bias network output path, filter the first biased pulse based on one or more properties of the first filter, and send a first filtered pulse on the first filter output path based on the processed first biased pulse, and the second filter is configured to receive the second biased pulse on the second bias network output path, filter the second biased pulse based on one or more properties of the second filter, and send a second filtered pulse on the second filter output path based on the processed second biased pulse.

In some aspects, the techniques described herein relate to a system, wherein one or more of the first filter or the second filter is one or more of a band pass filter, a high pass filter, a low pass filter, or a notch filter.

In some aspects, the techniques described herein relate to a system, wherein one or more of the first filter or the second filter is configured to modify a filter property based on an input signal.

In some aspects, the techniques described herein relate to a system, wherein the open detector is configured to: receive the first filtered pulse on the first filtered output path; receive the second filtered pulse on the second filtered output path; perform a comparison of the first filtered pulse and the second filtered pulse, with one or more of each other or one or more reference pulses; and initiate a mitigation action based on the comparison of the first filtered pulse and the second filtered pulse.

In some aspects, the techniques described herein relate to a system, wherein the mitigation action includes asserting a fault signal.

In some aspects, the techniques described herein relate to a system, further including: the battery configured to supply the DC power to the inverter; and the motor configured to receive the AC power from the inverter to drive the motor.

In some aspects, the techniques described herein relate to a method including: receiving, by one or more controllers, a first pulse, and transmitting, by the one or more controllers, a first galvanic isolator pulse based on the first pulse; receiving, by the one or more controllers, a second pulse, and transmitting by the one or more controllers, a second galvanic isolator pulse based on the second pulse; receiving, by the one or more controllers, the first galvanic isolator pulse and the second galvanic isolator pulse and transmitting by the one or more controllers, a first biased pulse based on the first galvanic isolator pulse and a second biased pulse based on the second galvanic isolator pulse; receiving, by the one or more controllers, the first biased pulse based and the second biased pulse and transmitting by the one or more controllers, a first filtered pulse based on the first biased pulse based and a second filtered pulse based on the second biased pulse based; receiving, by the one or more controllers, the first filtered pulse based and the second filtered pulse and transmitting by the one or more controllers, a first amplified pulse based on the first filtered pulse based and a second amplified pulse based on the second filtered pulse based; comparing, by the one or more controllers, the first amplified pulse and the second amplified pulse, with one or more of each other or one or more reference pulses; determining, by the one or more controllers, a mitigation action based on the comparing; and generating, by the one or more controllers, an output pulse based on the mitigation action.

In some aspects, the techniques described herein relate to a method, wherein the determining the mitigation action includes: determining, by the one or more controllers, a difference between one or more signal properties of the first amplified pulse and one or more signal properties of the second amplified pulse; comparing, by the one or more controllers, the difference to a difference threshold; and determining, by the one or more controllers, the mitigation action based on the comparing the difference to the difference threshold.

In some aspects, the techniques described herein relate to a method, wherein the mitigation action includes asserting a fault signal.

In some aspects, the techniques described herein relate to a method, wherein one or more of the first filtered pulse or the second filtered pulse is filtered based on a noise signal.

In some aspects, the techniques described herein relate to a method, wherein the comparing the first amplified pulse and the second amplified pulse includes performing a differential comparison.

In some aspects, the techniques described herein relate to a system including: a first galvanic isolator configured to receive a first pulse from a pulse transceiver and output a first galvanic isolator pulse based on the received first pulse; a second galvanic isolator configured to receive a second pulse from the pulse transceiver and generate a second galvanic isolator pulse based on the received second pulse; and one or more controllers configured to: receive the first galvanic isolator pulse and the second galvanic isolator pulse, perform a comparison of the received first galvanic isolator pulse and the received second galvanic isolator pulse, with one or more of each other or one or more reference pulses, and determine a fault in one or more of the first galvanic isolator or the second galvanic isolator based on the comparison of the received first galvanic isolator pulse and the received second galvanic isolator pulse.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
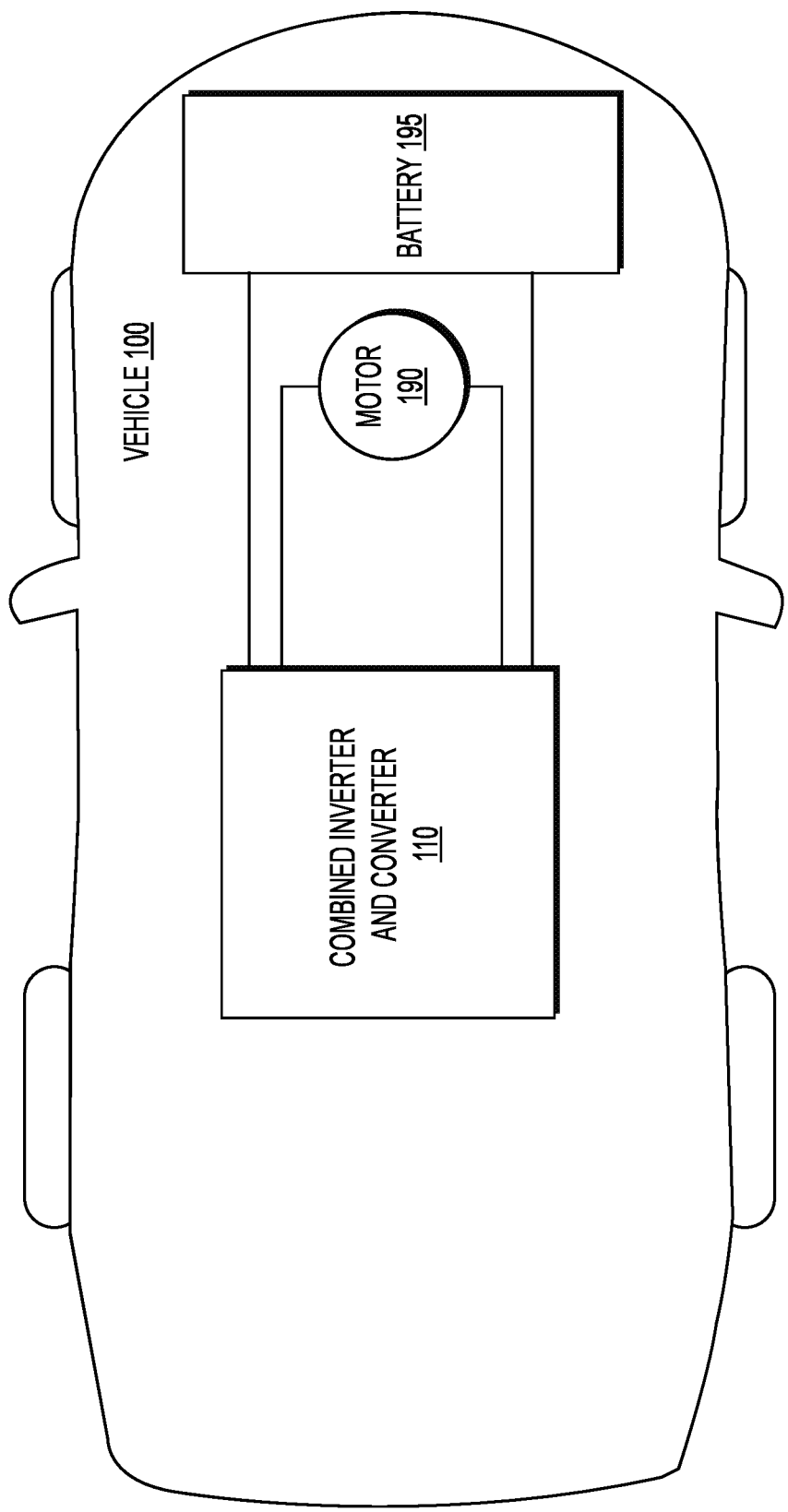
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal—oxide— semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for an open bond wire detector for a galvanic interface for an inverter for an electric vehicle, and, more particularly, to systems and methods for an open bond wire detector for a galvanic interface for a power module for an inverter for an electric vehicle.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three phase switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the phase switches. The phase switches may drive the phase voltage. The inverter may include an isolation barrier between low voltage and high voltage planes. Signals may pass from the PWM controller to the phase switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the phase switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5A to 15A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10A or approximately 100V, for example.

As introduced above, galvanic isolation may include isolating functional sections of electrical systems to prevent current flow such that, for example, no direct conduction path is permitted between such functional sections. For example, two circuits may be galvanically isolated such that the circuits are configured to communicate with each other, but may have respective reference grounds at different potentials. For example, some architectures use a circuit with four galvanic isolators, such as four capacitors, for transferring data between low voltage and high voltage planes. The galvanic isolation may include optical, transformer-based, or capacitance-based isolation, for example.

A gate driver may be a power amplifier or other electrical component that accepts an input from a controller, and may generate a drive input for the gate of a transistor. Galvanically isolated gate drivers may be used in automotive and industrial applications for communication between low voltage and high voltage planes, without causing harm to users or equipment.

One or more embodiments may include bond wires that connect the output of a low voltage controller to a high voltage controller across a galvanic isolator. Bond wires may include conductive material including, but not limited to, aluminum, copper, silver, gold, an alloy of the same, or a combination thereof. Bond wires may be connected to a circuit using any applicable manner, such as ball bonding, wedge bonding, or compliant bonding, for example.

One or more bond wires may connect a low voltage side transmitter of an integrated circuit to one or more capacitors at a high voltage side of a circuit, such as an integrated circuit, for example. An open bond wire may result in a loss of the differential nature of a given galvanic interface. Such a loss of the differential nature may render the galvanic interface and/or the gate drive integrated circuit more susceptible to interference (e.g., electromagnetic interference). For example, such interference may include common mode radio frequency (RF) noise (CMRFI).

Interference (e.g., electromagnetic interference, CMRFI, etc.) may result in propagation of incorrect commands and/or messages to gate drivers. For example, as a result of interference, a high voltage controller may receive and/or apply incorrect commands and/or messages from a low voltage controller. Such incorrect commands and/or messages may increase the risk of a short between a high side controller or driver and a low side controller or driver.

Some galvanic isolation integrated circuits may determine wire bond detection using an initial pulse (e.g., a heartbeat signal) through a signal path during initiation of a circuit, or by comparing the waveforms between a transmitter and receiver to determine the integrity of a given signal path. However, such initial pulses or waveform comparisons may result in a delay between a wire bond issue and the detection of the wire bond issue. Such delays may result in interference causing incorrect commands and/or messages to be propagated. Depending on a design of gate drive circuitry at a system level, this delay in determining a fault could prove catastrophic.

Some circuit architectures may use a differential pair tied together using a resistor network for biasing. This architecture may result in coupling of common mode (CM) noise into an open high voltage capacitor terminal, making the architecture incapable of detecting a bond connection issue (e.g., an open bond wire) during a CM noise event. Some architectures may use a separate galvanic capacitor for transmitting the carrier frequency. This may be used for detecting an open bond wire, but this architecture requires an additional high voltage galvanic capacitor, which uses additional area in a circuit.

One or more embodiments may perform open bond wire detection in the presence of CMRFI by amplifying signal paths separately followed by a high pass filter and gain blocks. The amount of filtering may be changed by varying the order and the frequency response of the filter. One or more embodiments may provide a bias network for a receiver, with placement of an open cap detection circuit before the main receiver, which may increase an immunity of the circuit to common mode RF noise coupling. One or more embodiments may provide a system to detect an open bond wire during mission mode in the presence of CMRFI, which may provide a faster fault response time. One or more embodiments may provide a system that may use significantly less circuit area, and may not require a special test procedure or mode to detect the integrity of a bond wire.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
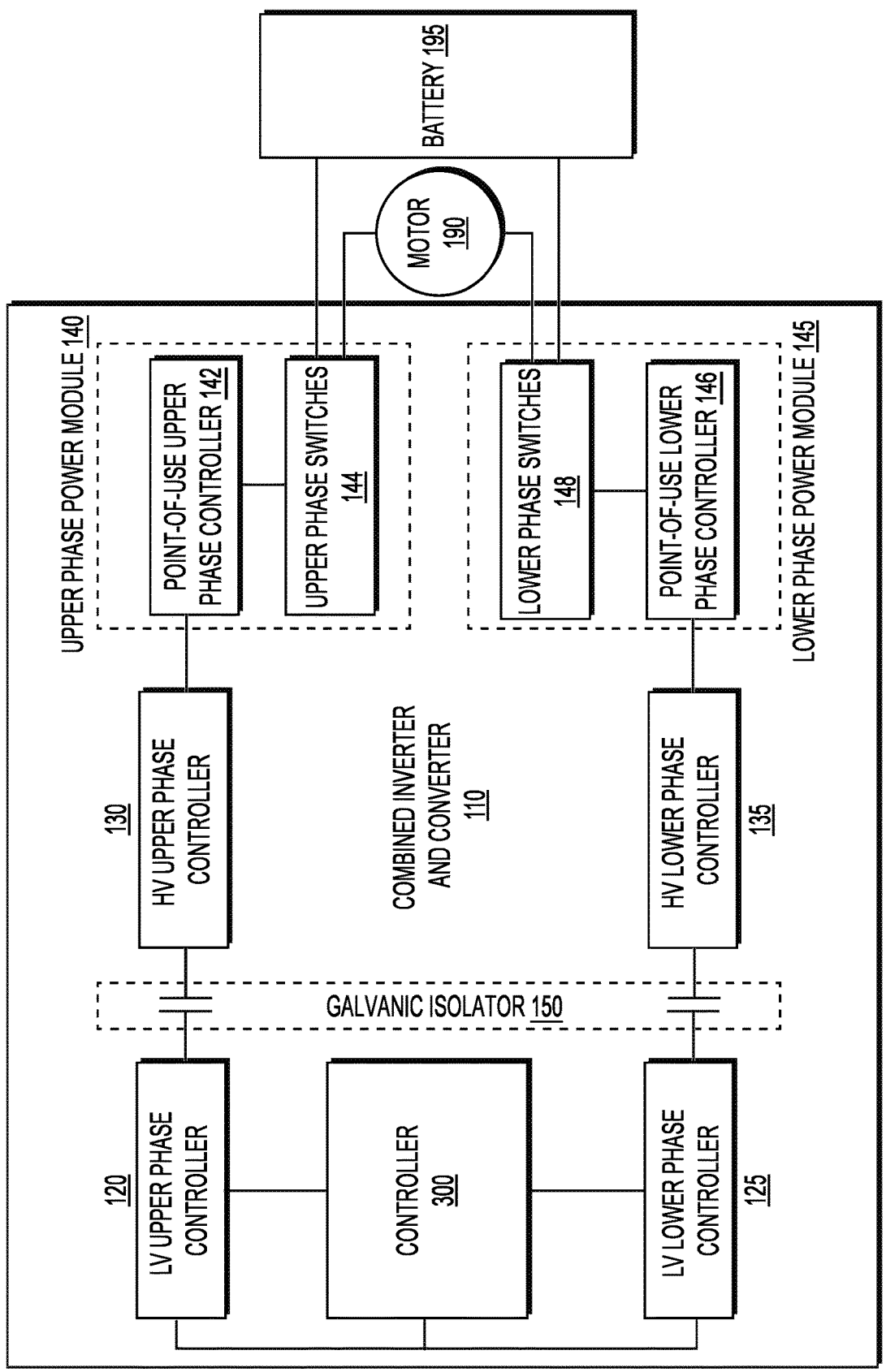
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries a complementary data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
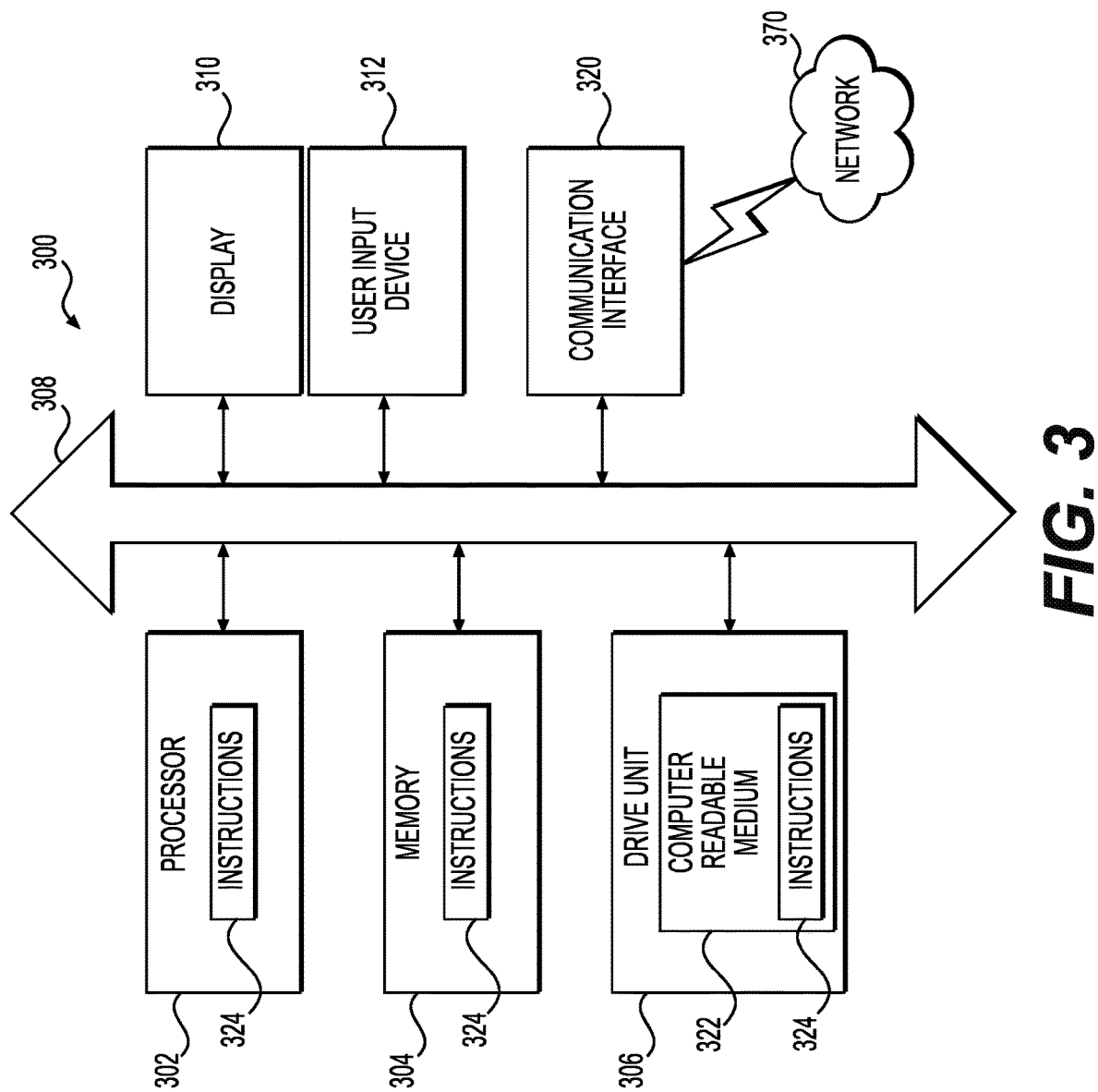
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
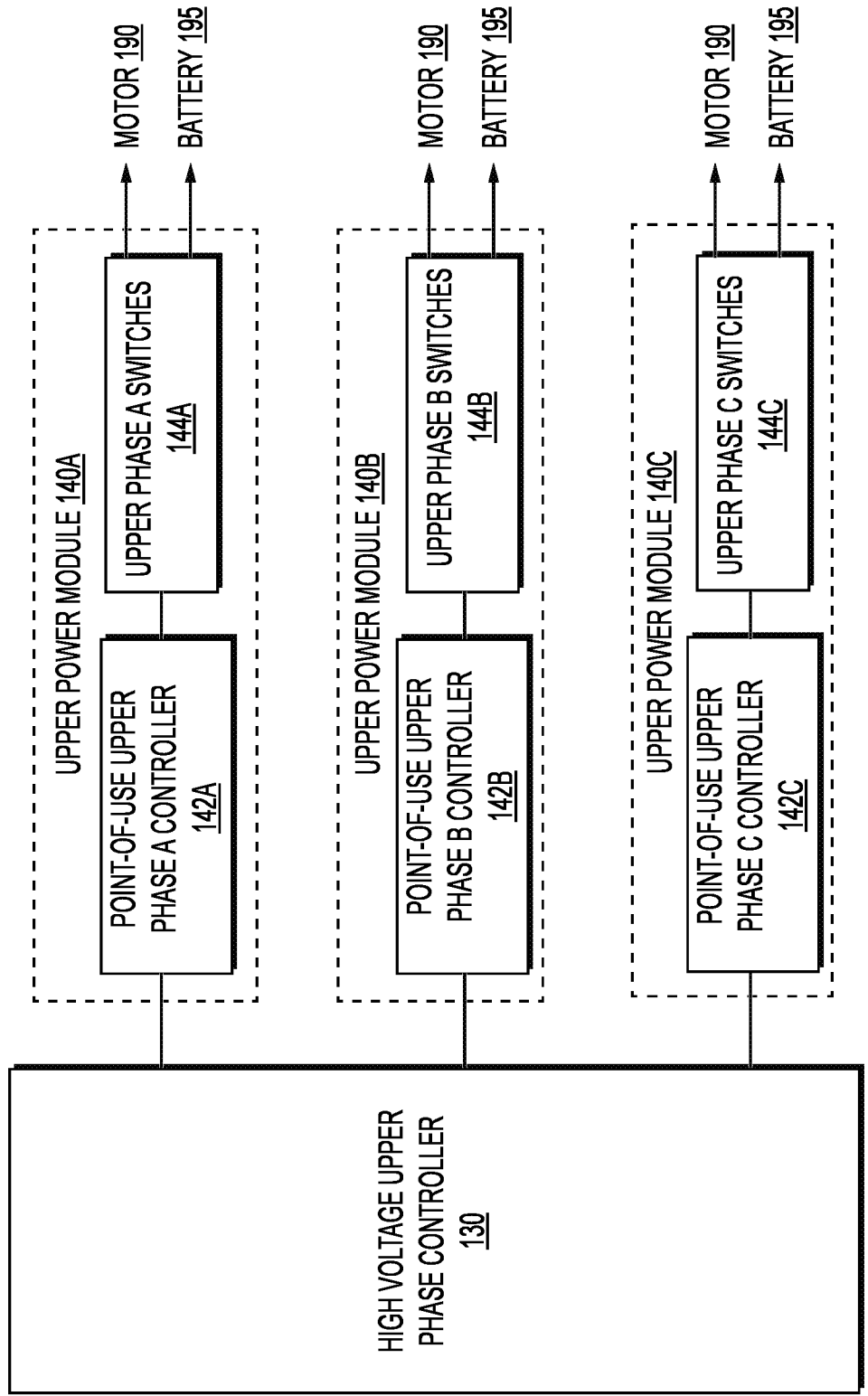
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
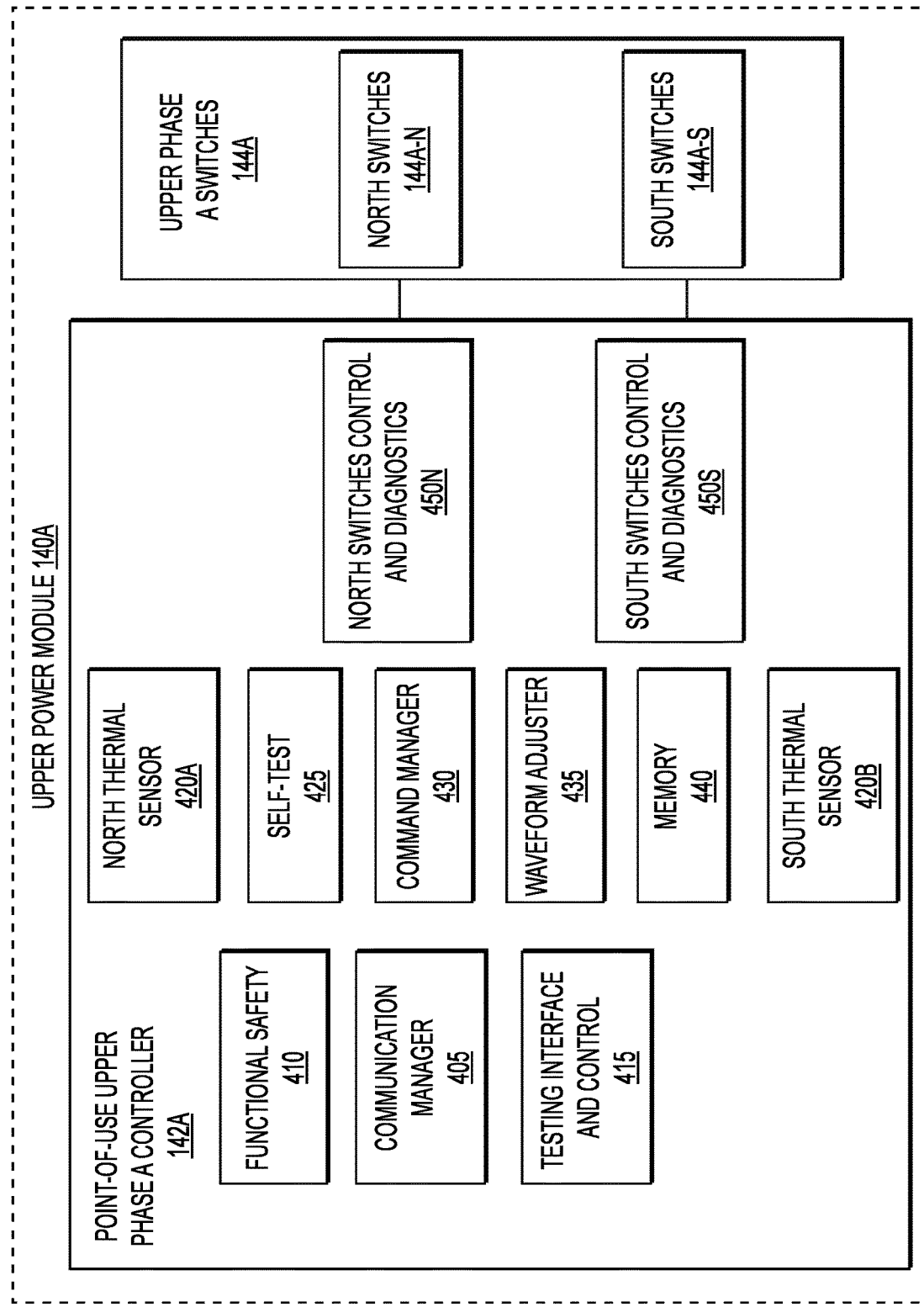
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and non-volatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
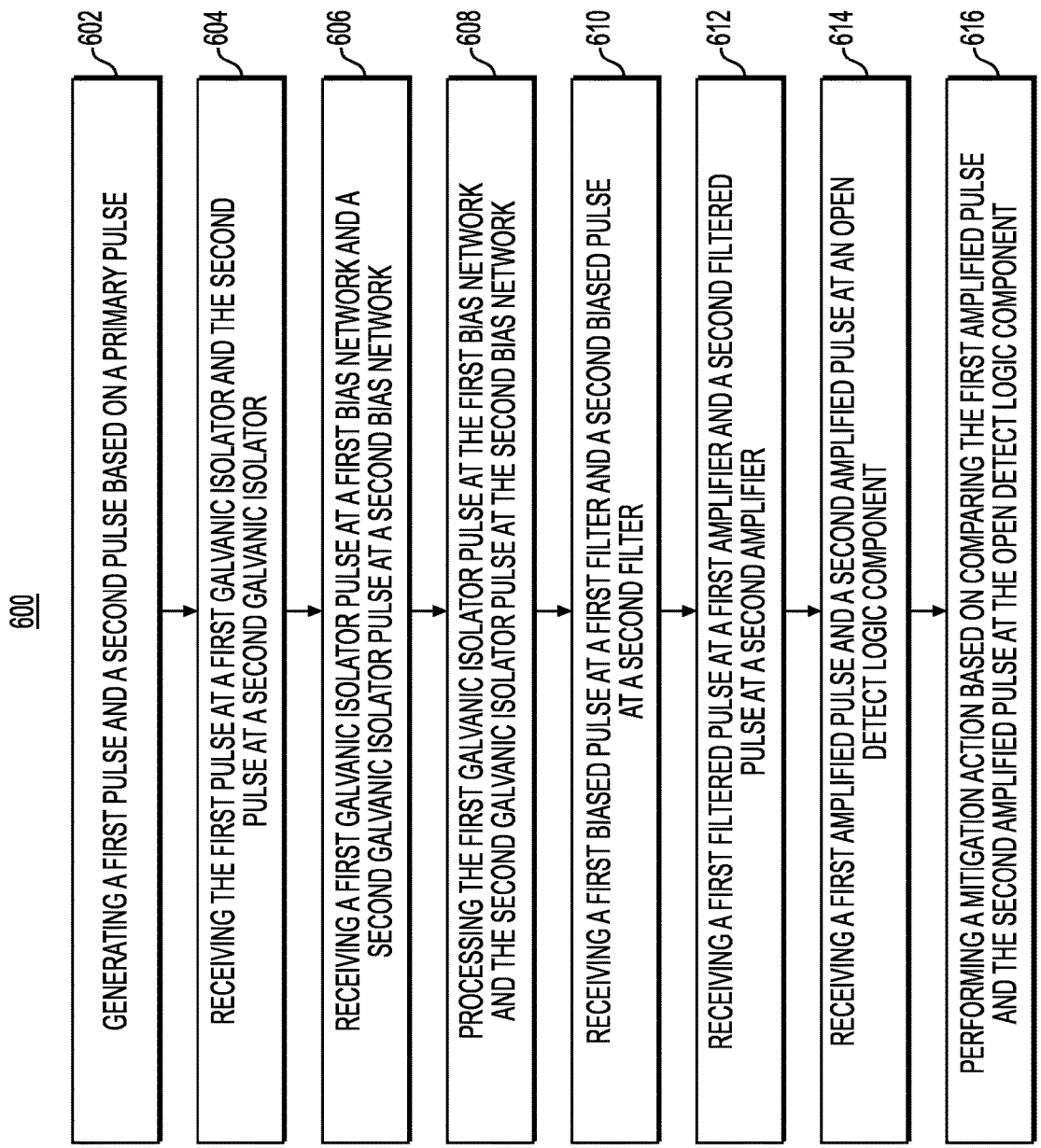
FIG. 6 depicts an exemplary method for open bond wire detection, according to one or more embodiments.

FIG. 6 depicts an exemplary method 600 for open bond wire detection across a galvanic interface. In operation 602, a pulse transceiver (e.g., a controller transceiver) may generate a first pulse and a second pulse. The first pulse and second pulse may be based on a primary pulse. The first pulse and the second pulse may be generated based on, for example, a drain voltage and a PWM-in signal, relative to a ground signal. The first pulse and the second pulse may be generated by the pulse transceiver to control a gate device and/or to indicate that a subsequent control signal is to be received by the gate device. The gate device may be upper phase switches 144, for example. The pulse transceiver may be located at a low voltage section of an electrical system. For example, with reference to FIG. 2, low voltage upper phase controller 120 may receive a PWM-in signal including a primary pulse from inverter controller 300, and may generate a first pulse and a second pulse based on the received primary pulse.

The first pulse and the second pulse generated at the pulse transceiver in operation 602 may be complementary (e.g. phase shifted by 180 degrees) signals of each other, for example. The first pulse and the second pulse may be transmitted via two different electrical paths, including a first path for the first pulse and a second path for the second pulse. In operation 604, a first pulse may be received at a first galvanic isolator via the first path, and a second pulse may be received at a second galvanic isolator via the second path.

The first path and/or the first galvanic isolator may be physically separated from the second path and/or the second galvanic isolator.

In operation 606, a first galvanic isolator pulse may be output from the first galvanic isolator and received at a first bias network, and a second galvanic isolator pulse may be output from the second galvanic isolator and may be received at a second bias network. The first bias network and second bias network may include approximately the same circuitry. Accordingly, the first galvanic isolator pulse and the second galvanic isolator pulse may pass through approximately the same circuitry via the first bias network and the second bias network, respectively. Alternatively, the first bias network and the second bias network may include different components, or the same or similar components configured differently.

In operation 608, the first bias network may process the first galvanic isolator pulse, and the second bias network may process the second galvanic isolator pulse based on one or more bias network properties. For example, the first bias network and/or second bias network may set direct current (DC) operating conditions (e.g., current and/or voltage) of the first galvanic isolator pulse and the second galvanic isolator pulse, respectively. The first bias network and/or second bias network may include one or more electronic components such as, but not limited to, one or more diodes, or one or more transistors, for example, which may process the first galvanic isolator pulse and second galvanic isolator pulse, respectively.

In operation 610, the first bias network may output a first biased pulse corresponding to the first galvanic isolator pulse, and the second bias network may output a second biased pulse corresponding to the second galvanic isolator pulse. The first biased pulse may be received at a first filter. The second biased pulse may be received at a second filter. The first filter and the second filter may include approximately the same circuitry. Accordingly, the first biased pulse and the second biased pulse may pass through approximately the same circuitry via the first filter and the second filter, respectively. Alternatively, the first filter and the second filter may include different components, or the same or similar components configured differently.

The first filter and/or the second filter may be one or more of a high pass filter, a band pass filter, a low pass filter, or a notch filter, for example. The first filter and/or the second filter may be configured to filter out interference frequencies. Such interference frequencies may be predetermined or dynamically determined. The first filter and/or the second filter may be variable filters such that the frequencies filtered by the first filter and/or the second filter may be modified. For example, such frequencies may be modified in response to a signal to modify a property (e.g., resistance, a capacitance, etc.) and/or modify a configuration (e.g., a series connection, a parallel connection, a switch, etc.) of the first filter and/or the second filter. The signal may be generated, for example, in response to predetermined or detected interference frequencies. Such detected interference frequencies may be detected using applicable electronic components (e.g., noise detection components) that may include one or more noise detection sensors, a processor, or a controller, for example. The signal may have signal properties used to determine the type and/or degree of modification.

In operation 612, the first filter may output a first filtered pulse corresponding to the first biased pulse, and the second filter may output a second filtered pulse corresponding to the second biased pulse. The first filtered pulse may be provided to a first amplifier. The second filtered pulse may be provided to a second amplifier. The first amplifier and the second amplifier may amplify the first filtered pulse and the second filtered pulse, respectively, based on one or more amplifier properties. For example, the first amplifier and the second amplifier may increase the voltage, current, and/or power of the first filtered pulse and the second filtered pulse, respectively.

In operation 614, the first amplifier may output a first amplified pulse corresponding to the first filtered pulse, and the second amplifier may output a second amplified pulse corresponding to the second filtered pulse. Each of the first amplified pulse and the second amplified pulse may be provided to an open detector. The open detector may include one or more electrical components to compare signal properties of the first amplified pulse with signal properties of the second amplified pulse. For example, the open detector may compare one or more of amplitudes, frequencies, or phases of the first amplified pulse and the second amplified pulse.

In operation 616, the open detector may compare the first amplified pulse and second amplified pulse to determine whether the difference in signal properties of the first amplified pulse and the signal properties of the second amplified pulse is within a threshold difference. When a difference in signal properties of the first amplified pulse and the signal properties of the second amplified pulse is below the threshold difference, the open detector may take a first mitigation action. The first mitigation action may include outputting a first match signal (e.g., a confirmed match signal) indicating that the first amplified pulse and the second amplified pulse are below the threshold difference. The first mitigation action may include taking no action. The first mitigation action may include causing an electrical component to accept or otherwise pass through the first pulse and/or the second pulse to one or more electrical components.

Alternatively, when the difference in signal properties of the first amplified pulse and the signal properties of the second amplified pulse is above the threshold difference, then the open detector may take a second mitigation action, the second mitigation action being different from the first mitigation action. The second mitigation action may include, for example, outputting a second match signal (e.g., a no match signal) indicating that the first amplified pulse and the second amplified pulse are above the threshold difference. The second mitigation action may include causing an electrical component to discard or otherwise ignore the first pulse and/or the second pulse.

Accordingly, the mitigation action may be a pass-through action such that the open detector may cause an output the first pulse and/or second pulse. Alternatively, the mitigation action may cause the open detect logic to hold (e.g., via hysteresis) or prevent outputting the first pulse and the second pulse when the difference between the first amplified pulse and the second amplified pulse is above a threshold difference. In this scenario, according to one or more embodiments, the open detector may cause the first pulse and/or the second pulse to be discarded such that the first pulse and the second pulse are not used to generate an output (e.g., a PWM out signal) via one or more electrical components. In this example, a previous output (e.g., a previous PWM out signal) may be held or maintained until a mitigation action occurs or until the difference between a subsequent first amplified pulse and subsequent second amplified pulse are below the threshold.

It will be understood that any operation (e.g., such as those disclosed in reference to FIG. 6) disclosed herein are not limited to be performed any specific order or sequence. Any order or sequence disclosed herein is only disclosed as an example, and one or more of the operations (e.g., of a given process) may be performed in any applicable manner, as understood by one skilled in the art.

Figure 7:
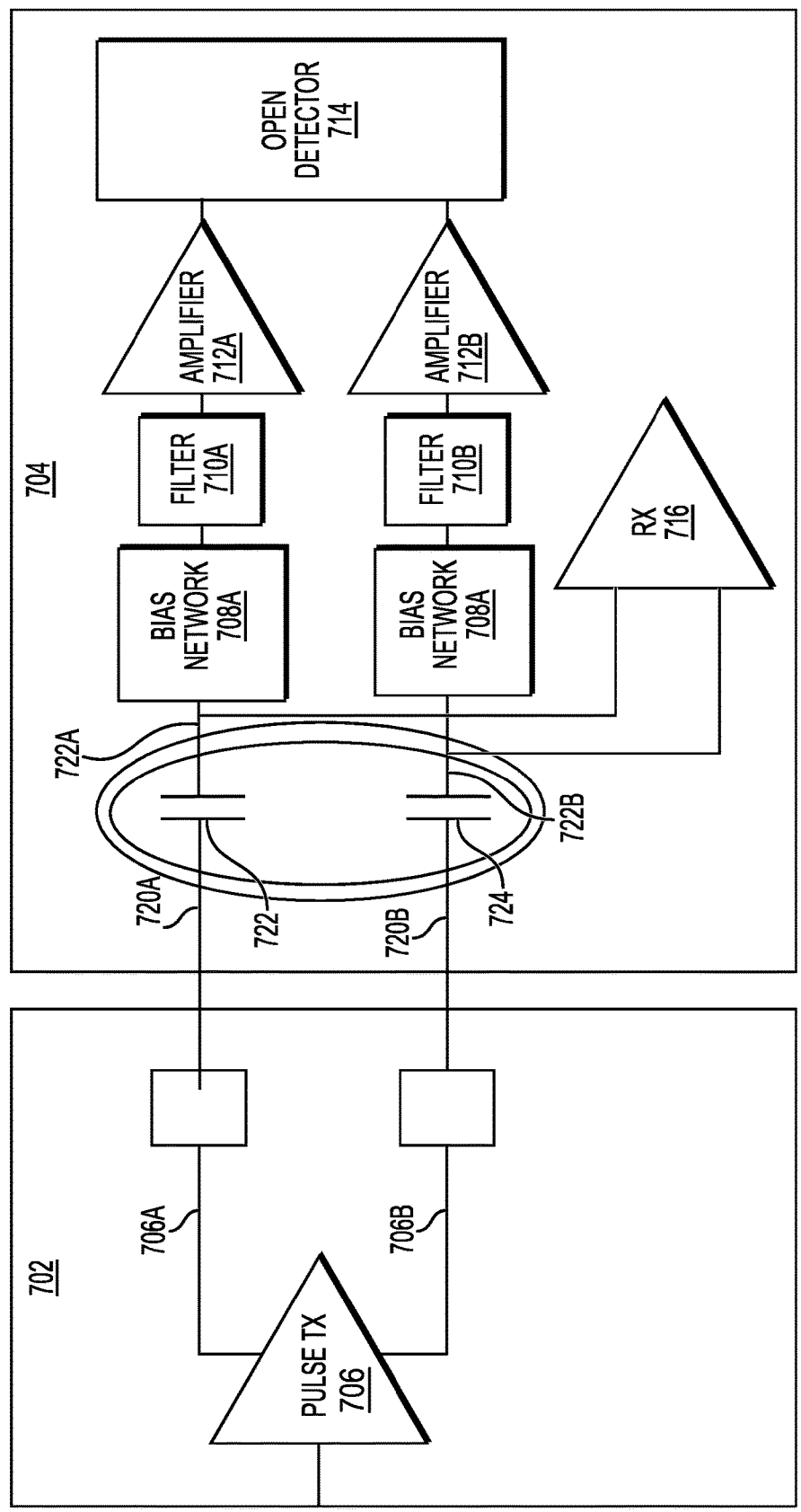
FIG. 7 depicts an exemplary system infrastructure for an open bond wire detector for a galvanic interface, according to one or more embodiments.

Accordingly, the techniques disclosed in the method 600 of FIG. 6 and the architecture described in controller 700 of FIG. 7 may be used to mitigate or prevent use of pulses that may be modified from interference. The parallel pulse signals disclosed herein may be used to identify interference signals due to, for example, high voltage components. The identification of interference signals may be conducted based on common mode rejection. However, the common mode rejection may require absence of bond connection issues, as disclosed herein.

Accordingly, the techniques disclosed in the method 600 of FIG. 6 and the architecture described in controller 700 of FIG. 7 may be used to determine a bond connection issue (e.g., open bonds, loose connections, etc.) across a galvanic interface. By ensuring an absence of such bond connection issues, the parallel pulses used herein may be validated for interference detection (e.g., using common mode rejection). These techniques may prevent or mitigate unwanted effects of CMRFI, for example.

These techniques may include comparing two parallel pulses generated by a pulse transceiver and received at a first galvanic isolator and a second galvanic isolator. The comparison may include determining differences between the two parallel pulses, where the two parallel pulses may be identical, similar, complementary, or inverse, when generated at the pulse transceiver. Bond connection issue (e.g., open bonds, loose connections, etc.) across a galvanic interface may cause signal properties for the two parallel pulses to be different (e.g., above a threshold amount), such that comparing the two parallel pulses, as disclosed herein, may identify the level of difference, if any. For example, an open bond connection or a highly resistive connection may result a difference above a threshold amount when comparing the first and second amplified pulses discussed herein. When differences above a threshold difference are detected, a determination may be made that a bond connection issue exists.

Accordingly, bond connection issues in the presence of CMRFI may be solved by amplifying the signal paths, of two parallel pulses, separately, followed by filtering operations and gain operations. The amount of filtering may be changed by varying the order of filter. The filtering may exclude noise from interfering with detection of bond connection issues, as discussed herein. Detection of bond connection issues may be conducted in a continuous manner, during operation of a controller (e.g., during a mission or operational mode) such that each first and second pulse, as disclosed herein, is analyzed for such bond connection issues prior to or in parallel to being passed through a main receiver. By detecting such bond connection issues for each first and second pulse during continued operation of a circuit, delays in such bond connection detection may be mitigated, preventing unwanted use of signals effected via interference. By filtering noise using the first or second filters disclosed herein, the open detector may accurately compare the first and second amplified signals disclosed herein, without deviations from noise interference. Although the bias networks and main receiver disclosed herein may be the same or similar, placement of the open capacitor detection circuit (e.g., the first and second bias networks, the first and second filter, the first and second amplifier, and/or the open detector) before or in parallel to the main receiver result in operations that are more immune to common mode RF coupling.

Figure 8:
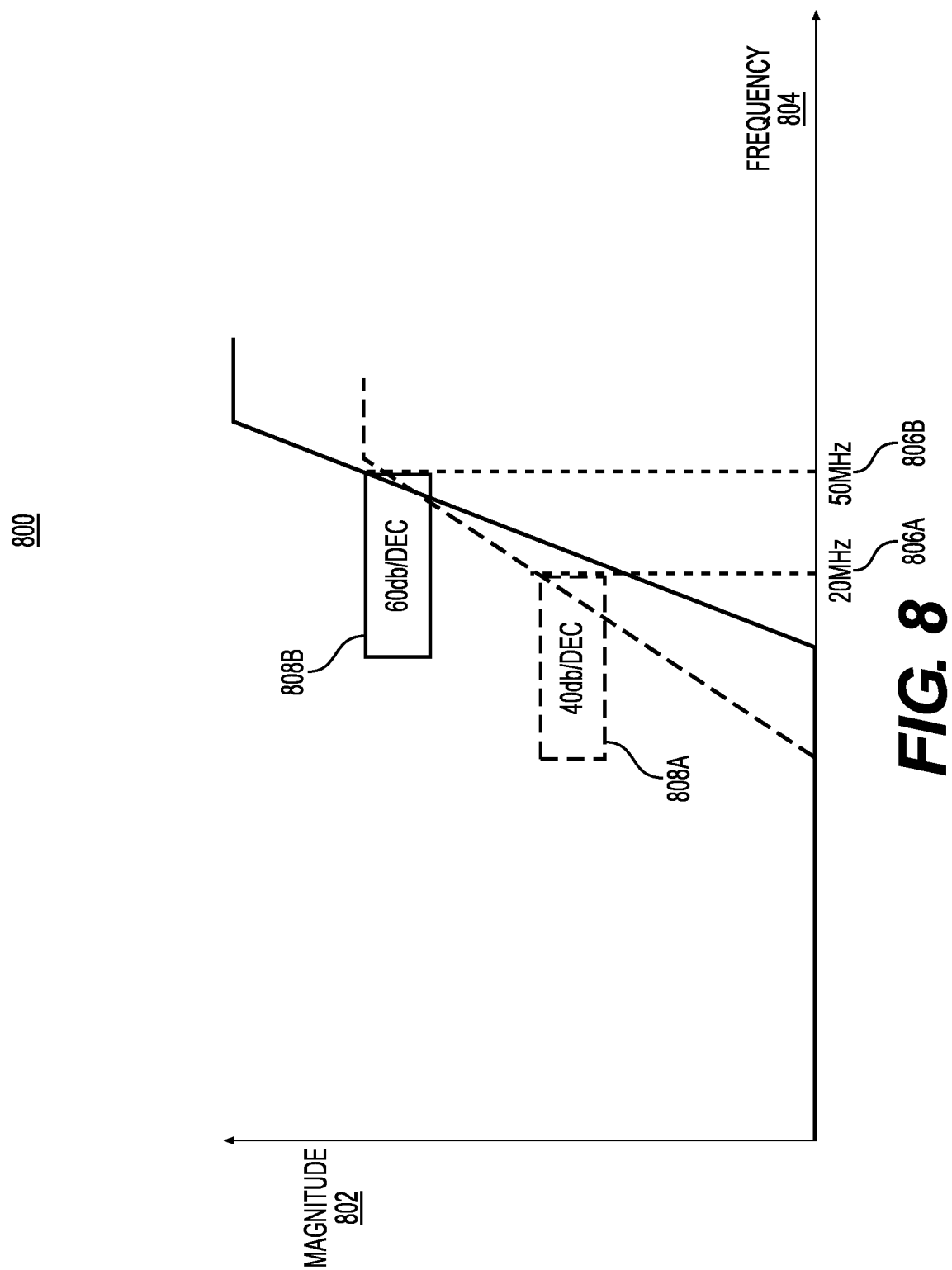
FIG. 8 depicts an exemplary plot for signal filtering for an open bond wire detector for a galvanic interface, according to one or more embodiments.

FIG. 7 depicts an exemplary system infrastructure for an open bond wire detector for a galvanic interface, according to one or more embodiments. FIG. 8 depicts an exemplary plot for signal filtering for an open bond wire detector for a galvanic interface, according to one or more embodiments. With reference to FIG. 2, phase controller 700 may be an implementation of low voltage upper phase controller 120 and high voltage upper phase controller 130, for example. As shown in FIG. 7, phase controller 700 may include a low voltage area 702 and a high voltage area 704. Low voltage area 702 and high voltage area 704 may be implementations of low voltage upper phase controller 120 and high voltage upper phase controller 130, respectively. The low voltage area 702 may include, be connected to, or be otherwise associated with low voltage components relative to high voltage area 704. Low voltage area 702 may be referenced herein as a primary area and high voltage area 704 may be referenced herein as a secondary area. Low voltage area 702 may include a pulse transceiver 706.

Pulse transceiver 706 may include one or more electrical components configured to receive a signal including a primary pulse, based on a drain voltage VDDL (not shown), a PWM-in signal (not shown), and/or a reference ground GNDL (not shown). PWM-in signal may be generated by inverter controller 300, for example. Pulse transceiver 706 may include one or more electrical components configured to output parallel pulses, based on the primary pulse. Pulse transceiver 706 may be configured to output the parallel pulses via a first pulse transceiver output path 706A and a second pulse transceiver output path 706B. Accordingly, pulse transceiver 706 may output a first pulse of the parallel pulses via first pulse transceiver output path 706A and a second pulse of the parallel pulses via second pulse transceiver output path 706B.

The first pulse may be received at a first galvanic isolator 722 via first wire bond 720A and the second pulse may be received by a second galvanic isolator 724 via second wire bond 720B. First galvanic isolator 722 and second galvanic isolator 724 may be implementations of galvanic isolator 150, for example. First wire bond 720A and/or the first galvanic isolator 722 may be physically separated from second wire bond 720B and/or the second galvanic isolator 724. First galvanic isolator 722 and/or second galvanic isolator 724 are positioned on high voltage area 704 and may be configured for an operational voltage of up to approximately 5000 volts, for example, or higher voltages.

First galvanic isolator 722 may output a first galvanic isolator pulse on first galvanic isolator output path 722A, and second galvanic isolator 724 may output a second galvanic isolator pulse on second galvanic isolator output path 722B. The first galvanic isolator pulse may be received at a first bias network 708A, and the second galvanic isolator pulse may be received at a second bias network 708B. First bias network 708A and second bias network 708B may include approximately the same circuitry. Alternatively, according to an embodiment, first bias network 708A and second bias network 708B may include different components, the same or similar components configured differently, or the like.

First bias network 708A may process the first galvanic isolator pulse and second bias network 708B may process the second galvanic isolator pulse based on one or more bias network properties. For example, first bias network 708A and/or second bias network 708B may set direct current (DC) operating conditions (e.g., current and/or voltage) of the first galvanic isolator pulse and the second galvanic isolator pulse, respectively. First bias network 708A and/or second bias network 708B may include one or more electronic components such as, but not limited to, one or more diodes, one or more transistors, one or more vacuum tubes, etc., which may process the first galvanic isolator pulse and second galvanic isolator pulse, respectively. First bias network 708A and/or second bias network 708B may create proper input impedances and biasing values for both paths, to minimize the common-mode noise amplitude and to equalize a remaining residual value to reduce effects on signal detection integrity.

First bias network 708A may output a first biased pulse corresponding to the first galvanic isolator pulse via a first bias network output path, and second bias network 708B may output a second biased pulse corresponding to the second galvanic isolator pulse via a second bias network output path. The first biased pulse may be received at a first filter 710A. The second biased pulse may be received at a second filter 710B. First filter 710A and second filter 7106 may include approximately the same circuitry. Alternatively, according to an embodiment, first filter 710A and second filter 710B may include different components, or the same or similar components configured differently.

First filter 710A and/or second filter 710B may be one or more of a high pass filter, a band pass filter, a low pass filter, or a notch filter, for example. First filter 710A and/or second filter 710B may have fixed frequency responses, or may have dynamically variable frequency responses, to reduce the harmful effects of RF common-mode noise on the detection of the main signals. First filter 710A and/or second filter 710B may be configured to filter out interference frequencies. Such interference frequencies may be predetermined or dynamically determined. First filter 710A and/or second filter 7106 may be variable filters such that the frequencies filtered by the first filter and/or the second filter may be modified. For example, such frequencies may be modified in response to a signal to modify a property (e.g., resistance, a capacitance, etc.) and/or modify a configuration (e.g., a series connection, a parallel connection, a switch, etc.) of first filter 710A and/or second filter 710B. The signal may be generated, for example, in response to predetermined or detected interference frequencies. Such detected interference frequencies may be detected using applicable electronic components (e.g., frequency-locked loop, phase-locked loop, filter bank, noise detection components) that may include one or more noise detection sensors, a processor, or a controller, for example. The signal may have signal properties used to determine the type and/or degree of modification.

First filter 710A and/or second filter 710B may be configured to filter out noise frequencies. For example, exemplary signal filtering plot 800 of FIG. 8 shows magnitude 802 in relation to frequencies 804. As shown, signal frequencies may be known to be in the range of approximately 20 MHz 806A to approximately 50 MHz 806B. Accordingly, first filter 710A and/or second filter 7106 may be configured to block or filter frequencies below approximately 20 MHz, above approximately 50 MHz, and/or allow frequencies between 20 MHz to approximately 50 MHz. First filter 710A and/or second filter 710B may be variable, as discussed herein. For example, the order of first filter 710A and/or second filter 710B may be adjusted (e.g., between approximately 40 dB per decade shown at point 808A to approximately 60 dB per decade shown at point 808B). The order may be adjusted, for example, signal or filtering frequencies. For example, first filter 710A and/or second filter 710B may be configured to reject noise at 20 MHz.

First filter 710A may output a first filtered pulse corresponding to the first biased pulse via a first filter output path, and second filter 710B may output a second filtered pulse corresponding to the second biased pulse via a second filter output path. The first filtered pulse may be provided to a first amplifier 712A. The second filtered pulse may be provided to a second amplifier 712B. First amplifier 712A and second amplifier 712B may amplify the first filtered pulse and the second filtered pulse, respectively, based on one or more amplifier properties. For example, first amplifier 712A and second amplifier 712B may increase the voltage, current, and/or power of the first filtered pulse and the second filtered pulse, respectively.

First amplifier 712A may output a first amplified pulse corresponding to the first filtered pulse via a first amplifier output path, and second amplifier 712B may output a second amplified pulse corresponding to the second filtered pulse via a second amplifier output path. Each of the first amplified pulse and the second amplified pulse may be provided to an open detector 714. Open detector 714 may include one or more electrical components to compare signal properties of the first amplified trimmed pulse with signal properties of the second amplified trimmed pulse. For example, open detector 714 may compare one or more of amplitudes, frequencies, or phases of the first amplified trimmed pulse and the second amplified trimmed pulse. For example, open detector 714 may compare the first filtered output with respect to a reference signal, while simultaneously comparing the second filtered output with respect to another reference signal to determine an open wire-bond fault.

Open detector 714 may determine whether the difference in signal properties of the first amplified pulse and the signal properties of the second amplified pulse is within a threshold difference. When a difference in signal properties of the first amplified pulse and the signal properties of the second amplified pulse is below the threshold difference, open detector 714 may take a first mitigation action. The first mitigation action may include outputting a first match signal (e.g., a confirmed match signal) indicating that the first amplified pulse and the second amplified pulse are below the threshold difference. The first mitigation action may include taking no action. The first mitigation action may include causing an electrical component to accept or otherwise pass through the first pulse and/or the second pulse to one or more electrical components.

Alternatively, when the difference in signal properties of the first amplified pulse and the signal properties of the second amplified pulse is above the threshold difference, then the open detector 714 may take a second mitigation action, the second mitigation action being different from the first mitigation action. The second mitigation action may include, for example, outputting a second match signal (e.g., a no match signal) indicating that the first amplified pulse and the second amplified pulse are above the threshold difference. The second mitigation action may include causing an electrical component to discard or otherwise ignore the first pulse and/or the second pulse.

As shown in FIG. 7, first bias network 708A, first filter 710A, first amplifier 712A, second bias network 708B, second filter 710B, second amplifier 712B, and open detector 714 may be provided in parallel with main receiver 716. In this configuration, main receiver 716 may receive signals from first galvanic isolator output path 722A and second galvanic isolator output path 722B in parallel with the open detector 714 components. Accordingly, open detector 714 may perform an open wire bond detection with no direct effect on main receiver 716. Open detector 714 may perform an open wire bond detection while main receiver 716 is operating in a mission mode, for example, during an operation of inverter 110. Open detector 714 may assert a fault signal when an open wire bond is detected, which may be used to control the operation of inverter 110.

One or more embodiments may perform open bond wire detection in the presence of CMRFI by amplifying signal paths separately followed by a filter (e.g. high pass, band pass, low pass, notch) and gain blocks. The amount of filtering may be changed by varying the order of filter. One or more embodiments may provide a bias network for a receiver, with placement of an open cap detection circuit before the main receiver, which may increase an immunity of the circuit to common mode RF coupling. One or more embodiments may provide a system to detect an open bond wire during mission mode in the presence of CMRFI, which may provide a faster fault response time. One or more embodiments may provide a system that may use significantly less circuit area, and may not require a special test procedure or mode to detect the integrity of a bond wire.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
   an inverter configured to convert DC power from a battery to AC power to drive a motor, wherein the inverter includes:
   a first galvanic isolator separating a low voltage area from a high voltage area, the first galvanic isolator having a first galvanic isolator output path;
   a second galvanic isolator separating the low voltage area from the high voltage area, the second galvanic isolator having a second galvanic isolator output path;
   a first bias network in the high voltage area, and connected to the first galvanic isolator via the first galvanic isolator output path, the first bias network having a first bias network output path;
   a second bias network in the high voltage area, and connected to the second galvanic isolator via the second galvanic isolator output path, the second bias network having a second bias network output path;
   a first filter in the high voltage area, and connected to the first bias network via the first bias network output path, the first filter having a first filter output path;
   a second filter in the high voltage area, and connected to the second bias network via the second bias network output path, the second filter having a second filter output path;
   a first amplifier in the high voltage area, and connected to the first filter via the first filter output path, the first amplifier having a first amplifier output path;
   a second amplifier in the high voltage area, and connected to the second filter via the second filter output path, the second amplifier having a second amplifier output path; and
   an open detector in the high voltage area, the open detector connected to the first amplifier via the first amplifier output path and connected to the second amplifier via the second amplifier output path.

2. The system of claim 1, further comprising:
   a pulse transceiver in the low voltage area, the pulse transceiver connected to the first galvanic isolator via a first pulse transceiver output path and connected to the second galvanic isolator via a second pulse transceiver output path.

3. The system of claim 2, further comprising a main receiver.

4. The system of claim 3, wherein the pulse transceiver and the main receiver are configured to operate together to transmit a Pulse Width Modulation signal from the low voltage area to the high voltage area.

5. The system of claim 2, wherein the pulse transceiver is configured to output a first pulse on the first pulse transceiver output path and a second pulse on the second pulse transceiver output path.

6. The system of claim 5, wherein the pulse transceiver is further configured to receive a primary pulse, and output the first pulse and the second pulse, based on the received primary pulse.

7. The system of claim 5, wherein:
   the first galvanic isolator is configured to receive the first pulse on the first pulse transceiver output path, and send a first galvanic isolator pulse on the first galvanic isolator output path based on the received first pulse, and
   the second galvanic isolator is configured to receive the second pulse on the second pulse transceiver output path, and send a second galvanic isolator pulse on the second galvanic isolator output path based on the received second pulse.

8. The system of claim 7, wherein:
   the first bias network is configured to receive the first galvanic isolator pulse on the first galvanic isolator output path, process the first galvanic isolator pulse based on one or more properties of the first bias network, and send a first biased pulse on the first bias network output path based on the processed first galvanic isolator pulse, and
   the second bias network is configured to receive the second galvanic isolator pulse on the second galvanic isolator output path, process the second galvanic isolator pulse based on one or more properties of the second bias network, and send a second biased pulse on the second bias network output path based on the processed second galvanic isolator pulse.

9. The system of claim 8, wherein:
   the first filter is configured to receive the first biased pulse on the first bias network output path, filter the first biased pulse based on one or more properties of the first filter, and send a first filtered pulse on the first filter output path based on the processed first biased pulse, and
   the second filter is configured to receive the second biased pulse on the second bias network output path, filter the second biased pulse based on one or more properties of the second filter, and send a second filtered pulse on the second filter output path based on the processed second biased pulse.

10. The system of claim 9, wherein one or more of the first filter or the second filter is one or more of a band pass filter, a high pass filter, a low pass filter, or a notch filter.

11. The system of claim 9, wherein one or more of the first filter or the second filter is configured to modify a filter property based on an input signal.

12. The system of claim 9, wherein the open detector is configured to:
   receive the first filtered pulse on the first filtered output path;

receive the second filtered pulse on the second filtered output path;

perform a comparison of the first filtered pulse and the second filtered pulse, with one or more of each other or one or more reference pulses; and initiate a mitigation action based on the comparison of the first filtered pulse and the second filtered pulse.

13. The system of claim 12, wherein the mitigation action includes asserting a fault signal.

14. The system of claim 1, further comprising:

the battery configured to supply the DC power to the inverter; and the motor configured to receive the AC power from the inverter to drive the motor.

15. A method comprising:

receiving, by one or more controllers, a first pulse, and transmitting, by the one or more controllers, a first galvanic isolator pulse based on the first pulse;

receiving, by the one or more controllers, a second pulse, and transmitting by the one or more controllers, a second galvanic isolator pulse based on the second pulse;

receiving, by the one or more controllers, the first galvanic isolator pulse and the second galvanic isolator pulse and transmitting by the one or more controllers, a first biased pulse based on the first galvanic isolator pulse and a second biased pulse based on the second galvanic isolator pulse;

receiving, by the one or more controllers, the first biased pulse based and the second biased pulse and transmitting by the one or more controllers, a first filtered pulse based on the first biased pulse based and a second filtered pulse based on the second biased pulse based;

receiving, by the one or more controllers, the first filtered pulse based and the second filtered pulse and transmitting by the one or more controllers, a first amplified pulse based on the first filtered pulse based and a second amplified pulse based on the second filtered pulse based;

comparing, by the one or more controllers, the first amplified pulse and the second amplified pulse, with one or more of each other or one or more reference pulses;

determining, by the one or more controllers, a mitigation action based on the comparing; and generating, by the one or more controllers, an output pulse based on the mitigation action.

16. The method of claim 15, wherein the determining the mitigation action comprises:

determining, by the one or more controllers, a difference between one or more signal properties of the first amplified pulse and one or more signal properties of the second amplified pulse;

comparing, by the one or more controllers, the difference to a difference threshold; and determining, by the one or more controllers, the mitigation action based on the comparing the difference to the difference threshold.

17. The method of claim 15, wherein the mitigation action includes asserting a fault signal.

18. The method of claim 15, wherein one or more of the first filtered pulse or the second filtered pulse is filtered based on a noise signal.

19. The method of claim 15, wherein the comparing the first amplified pulse and the second amplified pulse comprises performing a differential comparison.

20. A system comprising:

a first galvanic isolator configured to receive a first pulse from a pulse transceiver and output a first galvanic isolator pulse based on the received first pulse;

a second galvanic isolator configured to receive a second pulse from the pulse transceiver and generate a second galvanic isolator pulse based on the received second pulse; and one or more controllers configured to:

receive the first galvanic isolator pulse and the second galvanic isolator pulse, perform a comparison of the received first galvanic isolator pulse and the received second galvanic isolator pulse, with one or more of each other or one or more reference pulses, and determine a fault in one or more of the first galvanic isolator or the second galvanic isolator based on the comparison of the received first galvanic isolator pulse and the received second galvanic isolator pulse.

* * * * *